United States Patent [19]

Campman

[11] 3,732,497

[45] May 8, 1973

[54] TRANSISTOR TRANSMITTER USING VARIABLE LINE LENGTH TUNER

[75] Inventor: James P. Campman, Silver Spring, Md.

[73] Assignee: Vidar Laboratories, Inc., Kensington, Md.

[22] Filed: Feb. 10, 1971

[21] Appl. No.: 114,156

[52] U.S. Cl. ....................325/105, 325/111, 325/145

[51] Int. Cl. ....................H04b 1/04

[58] Field of Search....................325/105, 127, 145, 325/160, 125, 126, 128, 129; 336/133, 138

[56] References Cited

UNITED STATES PATENTS

| | | | |
|---|---|---|---|
| 3,464,031 | 9/1969 | Rozen | 325/105 |
| 2,835,796 | 5/1958 | King | 336/138 |
| 2,895,115 | 7/1959 | Majkrzok | 336/138 |
| 3,521,169 | 7/1970 | Turner et al. | 325/105 |

*Primary Examiner*—Robert L. Griffin
*Assistant Examiner*—William S. Moore
*Attorney*—Jack H. Linscott

[57] ABSTRACT

A transistor controlled transmitter whose modulation process occurs in the square law region by which is achieved extremely sensitive frequency modulation without the necessity of pre-amplifying stages for the modulating signal. A resonant circuit consists of an LC combination, the reactance of which is variable to change the oscillation frequency in the continuous mode. The variable reactance has physical dimensions which have been calculated to give a frequency of oscillation selectively over the FM band with maximum sensitivity and frequency stability. Other functions accomplished by the tuning means concomitant with the act of tuning include electromagnetic radiation of the modulated carrier wave with an essentially omnidirectional pattern, resonance of sufficient quality to smoothly adjust the frequency of oscillation, and control means having a unique position which obviates the need for a separate on-off switch.

3 Claims, 14 Drawing Figures

INVENTOR
James P. Campman

BY Dennison, Dennison, Townsend & Meserole

ATTORNEYS

INVENTOR
James P. Campman

BY Dennison, Dennison, Townshend & Meserole

ATTORNEYS

INVENTOR
James P. Campman

BY Hennison, Hennison, Townshend & Meserole
ATTORNEYS

TRANSISTOR TRANSMITTER USING VARIABLE LINE LENGTH TUNER

BACKGROUND OF THE INVENTION

1. Field of the Invention

This invention relates generally to a transistor controlled transmitter and, particularly, to a common base transistor exhibiting in the base-emitter region reactance modulation for varying the frequency of a carrier on either side of a center frequency. This invention relates, more particularly, to a means for achieving excellent modulation characteristics. Precise tuning over the FM band is achieved by a variable length tuner which combines control and reactive functions intertwined in such a way as to produce audio effects most pleasing to the ear.

2. Description of the Prior Art

Among the major problems associated with the prior art which deals with transistorized transmitters have been the size and production costs of the units, impedance matching, limited propagation, and the relatively large power packs required. In the case of frequency modulated transmitters, other difficulties commonly encountered include such factors as poor frequency stability due to power variations or limitations, tuning insensitivities introduced by poorly matched components, and weaknesses in propagation characteristics brought about by overly demanding functions imposed on critical components in the circuit. Along with these and other typical problems, prior art FM transmitters using transistors suffer from insufficient gain unless preceded in the circuit by usually one or more stages for boosting the modulating signal to an acceptable level to provide optimum frequency deviation for driving the antenna. Such additional stages of amplification are undesirable principally because of their added cost, by virtue of the additional components required, as well as for the objectionable current drain which their use entails. At times also, radiation patterns of portable transmitting units forestall satisfactory operation unless due attention is paid to the exact angular relation of the transmitter antenna to the receiving station. Thus, there remains a need in the art for an improved transmitter of miniature size which has adequate range and fidelity at all frequencies.

SUMMARY

The invention in one form comprises a low cost frequency modulated transmitter characterized by extremely sharp response to the modulating signal, the use of a minimum of conventional components, an associated tuning means whose use contributes to savings in cost, power and space, and a manufacturing operation readily adaptable to automated assembly processes. Other features, accounted for by ease of tuning and modulation in the square law region, permit low production costs, excellent radiation coupling, and a most acceptable degree of frequency modulation.

Accordingly, one object of the present invention is to provide a transistor controlled oscillator allowing a high gain modulation process.

A further object of the invention is to provide a transistor controlled transmitter which has propagation characteristics essentially independent of directional constraints.

Another object of the invention is to provide a transistor controlled transmitter having improved tuning means for determining the frequency of oscillation.

Still another object of the invention is to provide a tuned-collector oscillator which makes possible stable operation over a range of frequencies suitable for frequency modulation broadcasting.

Yet another object of the invention is to provide a miniature transmitter which is simple in construction, esthetic in appearance, inexpensive to manufacture, and capable of adaptation to existing sources of modulating material with virtually no modification to the existing sources.

Other objects and characteristic features of the invention will become apparent as a detailed description of an exemplified embodiment proceeds, it being noted that similar reference characters refer to similar components in each of the several views.

BRIEF DESCRIPTION OF THE DRAWINGS

Referring now to FIG. 1, the transistor controlled transmitter of the invention is designated as a whole by the reference character 10. The transmitter 10 comprises a commonbase configuration using a transistor 12 with the feedback supplied from collector to emitter through a capacitor 14. A resistor 16 is connected between the collector and base of transistor 12. Capacitor 18 couples the base of transistor 12 to ground thereby bypassing the A.C. signal to ground and preventing degeneration. The emitter of transistor 12 is connected to ground by means of resistor 20. The base of transistor 12 is further coupled, via resistor 22, to one input terminal 24 acting in conjunction with a second terminal 26 coupled to ground.

Figure 1:
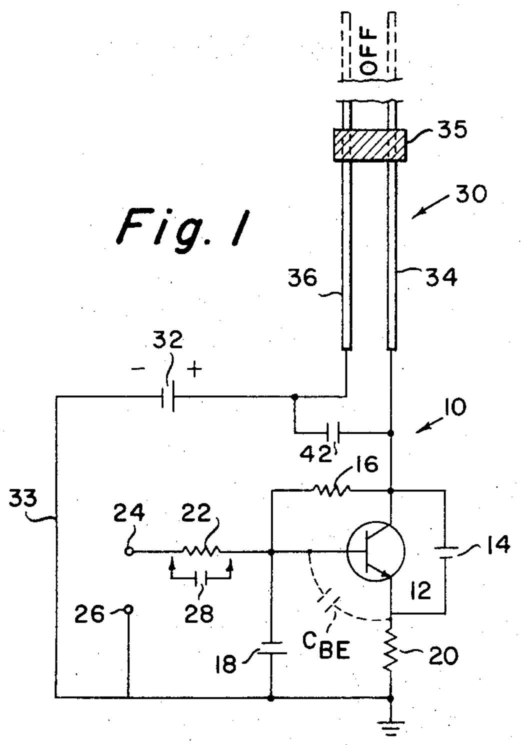
FIG. 1 is a schematic diagram of a transistor controlled transmitter in accordance with the invention.

As employed in the grounded-base oscillator of the present invention, resistors 16 and 20 form a bias network which provides the necessary potential for biasing the base-emitter junction of transistor 12 into the square law region of its characteristic curve. Resistor 22 provides a resistance for attenuating the input signal and also serves as an isolation resistor for DC voltages. If found desirable, maximum sensitivity to input voltages applied across the emitter-base junction will be exhibited by optionally placing a capacitor 28 in shunt across resistor 22. The capacitor $C_{BE}$ shown in FIG. 1 by means of short interrupted line lengths represents the electrostatic or intrinsic base-to-emitter capacitance of transistor 12.

In the understanding of the present invention, the capacitance $C_{BE}$ has important significance when viewed in conjunction with the intrinsic base-to-emitter resistance $r_e$ (not shown). The collector of transistor 12 is connected via a variable line length tuning means, generally designated herein by the reference character 30, to a source of unidirectional current voltage 32 whose negative terminal, by virtue of connection to line 33, represents circuit ground.

The variable line length tuning means 30 as shown in FIG. 1 comprises two electrical conductors or blades 34 and 36 of predetermined length disposed in spaced parallel relationship to each other so as to physically, as well as electrically, extend outwardly or project from the point of electrical connection mode with transmitter 10.

This point of connection couples the collector of transistor 12 to one end of conductor 34. A corresponding end of conductor 36 is coupled to the positive terminal of source 32 thereby completing the paths for providing the biasing potentials suitable for operating transistor 12 in the square law region. To complete the resonant circuit, a capacitor 42 is connected in parallel across conductors 34 and 36.

Figure 2:
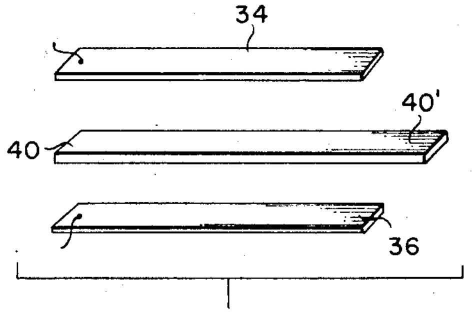
FIG. 2 is a view in perspective showing in greater detail one form of tuning means as applied to the schematic of the invention shown in FIG. 1.

A shorting slide or variable position shunt 35 having the property of electrical conductivity is operably disposed on conductors 34 and 36 for sliding movement longitudinally of the conductors such that the equivalent line length of the means 30 is readily varied by adjustment of its position. It has been found desirable to insulate the conductors 34 and 36 electrically from each other substantially completely along their radiating surfaces by providing them with a stationary mounting upon a dielectric base. One example of an assembly offering satisfactory characteristics in this regard is shown in FIG. 2, wherein may be seen two blade-like conductors 34 and 36 of essentially rectangular cross section adapted to be mounted upon a dielectric base 40 of substantially rectangular cross section. The base 40 may be selected from one of several well known dielectric materials which offer extremely high electrical insulation coupled with lightness and rigid mechanical support. For reasons to be explained hereinafter, base 40 may have a length greater than that of conductors 34 and 36 thereby providing a portion 40¹ of the base which is bare of any conductive material.

Figure 3:
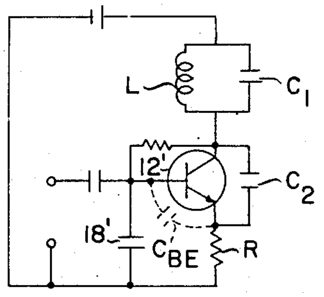
FIG. 3 is a view of a conventional grounded base oscillator.
Figure 4:
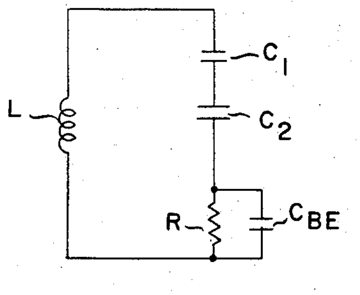
FIG. 4 represents the electrical equivalent of certain reactive components shown in the FIG. 3 circuit.

The frequency of oscillation in FIG. 1 is essentially determined by the tuning means 30 consisting of the reactance presented by conductors 34 and 36 and the reactance of capacitor 42. It should also be appreciated that the combination of the tank circuit reactance and the combination of the capacitive reactance of capacitor 14 and capacitance $C_{BE}$ also play an important part in determining the instantaneous frequency of oscillation. This proposition may be theorized effectively by recognizing that the inherent capacitance of a diode junction offers a circuit configuration that can operate as a reactance modulator. For purposes of discussing this phenomenon further, reference is made to the grounded base oscillator of FIG. 3 and its electrical equivalent of FIG. 4 in which certain parameters not essential to the discussion have been omitted. Since the capacitor 18¹ shown in FIG. 3 is an ac bypass for the base of transistor 12¹, the base-to-emitter capacitance $C_{BE}$ is shown in FIG. 4 effectively coupled to ground in shunt to the resistor R.

The frequency at which transistor 12 is designed to oscillate is roughly approximated by the equation:

$$f_o \approx 1 / \sqrt{L^1 C^1} \quad (1)$$

wherein $L^1$ and $C^1$ are total circuit values.

From FIG. 4, it follows that:

$$L^1 = L, \text{ and} \quad (2)$$

$$C' \approx [(1/C') + (1/C^2)] \cdot [1/(1-\Delta C_{BE})] \quad (3)$$

Since $C_{BE}$ is a variable, equation (3) reduces to $$C^1 \approx K\,[1/(1-\Delta C_{BE})] \quad (4)$$

Thus, although the majority of the oscillatory current may be traced to excitation of the tank circuit tuning means 30, the capacitance $C_{BE}$ also acts as a reactive component which develops very significant modulating effects on the frequency of collector current. In considering further the effect of $C_{BE}$ upon the frequency modulated signal, it will be recalled that the con-ventional common base configuration is biased to operate over the linear portion of its operating curve outside the square law region. The modulating input signals of such oscillators have generally been on the order of millivolts to obtain satisfactory operation, and, indeed, some designers have experienced the need for developing modulating signals greater by an order of magnitude to the extent of inserting preamplifying stages producing a modulating input on the order of several volts. The extremely sensitive base-to-emitter capacitance $C_{BE}$ of transistor 12 tends to minimize the amplitude of the modulating signal necessary to achieve satisfactory swing of the unmodulated carrier. The consequences according to the invention result in an efficient transmitter with low dissipative losses internally and coupling to the atmosphere for external radiation. In this respect, consider the following example. It is peculiar to the invention embodiment of FIG. 1 that for a change of ±0.075 percent of the total capacitance 100 percent frequency modulation is obtained. This small change in capacitance is to a significant degree attributable to the variant $C_{BE}$ of transistor 12; by proper selection of the bias conditions on transistor 12, the capacitance $C_{BE}$ can be made to vary as the square of the applied modulating signal. Let it be assumed that the operating frequency $f_o$ of transmitter 10 is set at 100mhz. For 100 percent frequency modulation, the frequency excursion is ±75Khz. Applying the ±0.075 percent capacitance change to produce 100 percent frequency modulation, this result will be brought about by the factor $\pm 0.00075 \times f_o$. Brought to its conclusion, the product equals $\pm 75 \times 10^{-} \times 10^{8}$, or, ±75Khz. If it is further assumed that the total circuit resonating capacitance is equal to approximately 25pf, and a linear relation is applied to $C_{BE}$, the total change required for $C_{BE}$ to produce 100 percent modulation is $(\pm 75 \times 10^{-5})(25 \times 10^{-12})$ =35 0.01875pf. It will therefore be appreciated that the $\Delta C_{BE}$ of transistor 12 adequately satisfies the objectives of the present invention, that is, an essentially non-critical reactive component whose variation is a matter of infinitesimally small values of modulating voltages, in terms of present standards, to produce 100 percent frequency modulation of the carrier frequency. The low driving signal permitted by the reactance modulator of the present invention eliminates many potential problems associated with conventional voice signal transducers. This conclusion has found convincing support in the case of low level output devices such as, for example, the output head of a tape deck. Even the crudest of transducers when applied to terminals 24 and 26 to provide the modulating input for the disclosed circuit, have been found to produce extremely satisfactory audio effects notwithstanding the fact that no pre-amplifying devices were used. That this is the case was experimentally verified by an extremely broad frequency response for the device of FIG. 1 which extended over a range of input signals from D.C. to greater than 75Khz. The D.C. response materializes, of course, at removal of the capacitor 28 from shunt of resistor 22.

As was explained hereinabove, the variable line length tuning means 30 consists essentially of two parallel conductors separated by a dielectric of either air, glass, mica or other suitable insulating material, in conjunction with a suitable shorting bar that is freely movable to slide the length of the longitudinally extending assembly. However, the shape of its physical construction, the variable length tuning means 30 of the disclosed transmitter 10 implements the feature of closely spaced conductive elements separated by a suitable dielectric. Considering further FIG. 2, the free ends of conductors 34 and 36 terminate at a point short of the free end of base 40. With this arrangement, the means 30 acts further as a control switch for, when the slide 35 is moved to the portion 40¹ on base 40 where it no longer makes electrical contact with the conductors 34 and 36, the path through the conductors 34 and 36 from source 32 for operating transistor 12 is interrupted. As such, the circuit 10 does not operate.

Figure 5:
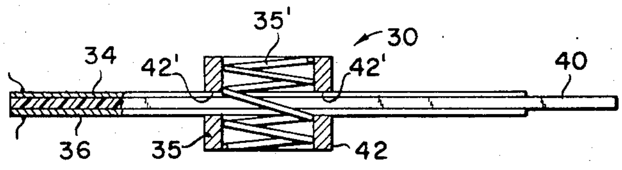
FIGS. 5 and 6 more specifically illustrate one form of shorting slide used with the variable length tuner of the present invention.
Figure 6:
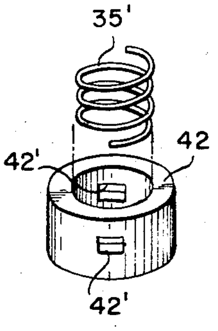

One arrangement of the shorting slide for the purpose of tuning the operating frequency is illustrated in FIGS. 5 and 6 in which the shorting slide 35 comprises a spiral spring 35¹ urged into contact with conductors 34 and 36. The spring 35¹ is constrained against movement away from the parallel conductors by virtue of being mounted in an annulus 42 having therein slots or openings 42¹ which engage the ends of spring 35¹. The spring 35¹ is designed with a proper shape so that a smooth variation in the center frequency is made possible throughout its range of movement. The annulus 42, moreover, presents a desirable barrier against disruptive effects upon the frequency of oscillation which could be anticipated through human contact with the spring 35¹.

Figure 7:
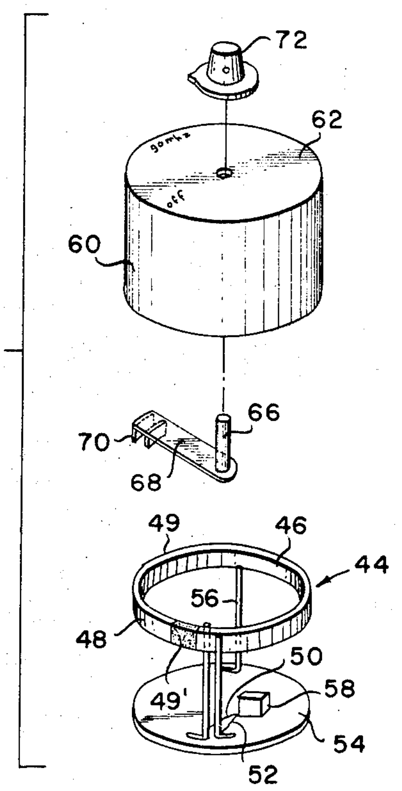
FIGS. 7 and 8, in exploded form, shows two other forms of variable length tuning means which may be provided in FIG. 1 in accordance with the invention.

In FIG. 7, I have shown another form of tuning means 30 in which the variable inductance element comprises a single turn coil 44 having concentric electrical conductors 46 and 48 deposited in fixed fashion upon a circular cladding 49 of insulating material. The cladding 49 includes an arcuate portion 49¹ left uncoated by the conductors 44 and 56. Electrical leads 50 and 52 depend from the conductors 46 and 48, respectively, to a base 54. A dummy support 56 completes the mounting of coil 44. A circuit element 58 which represents the device 10 of FIG. 1 is connected to the leads 50 and 52. Mounted over the coil so as to react against the base 54 is a cover 60 having a planar top surface 62 having angular graduations representing the FM band. The surface 62 is provided centrally with an aperture 64 through which extends the operating shaft 66 of a rotor 68 having a radially extending insulating portion which terminates in a pair of connected radially displaced downwardly extending metal wipers 70 intended to brush against conductors 46 and 48 of coil 44. For operating rotor 68, a knob 72 fixedly engages the shaft 66 of rotor 68. As will be evident from the construction illustrated, as knob 72 is rotated the wipers 70 engage, during their rotation, the conductors 46 and 48 of coil 44 thereby varying the length of the line and thus varying the resonant frequency thereof.

In one exemplary embodiment, the coil 44 was approximately 2 inches in diameter. It will be appreciated that the uncoated section 49¹ of coil 49 serves conveniently as a switch adapted to interrupt the bias voltages applied to circuit 58 at the time that the wipers 70 are brought to a stop on portion 49¹ of coil 49.

Figure 8:
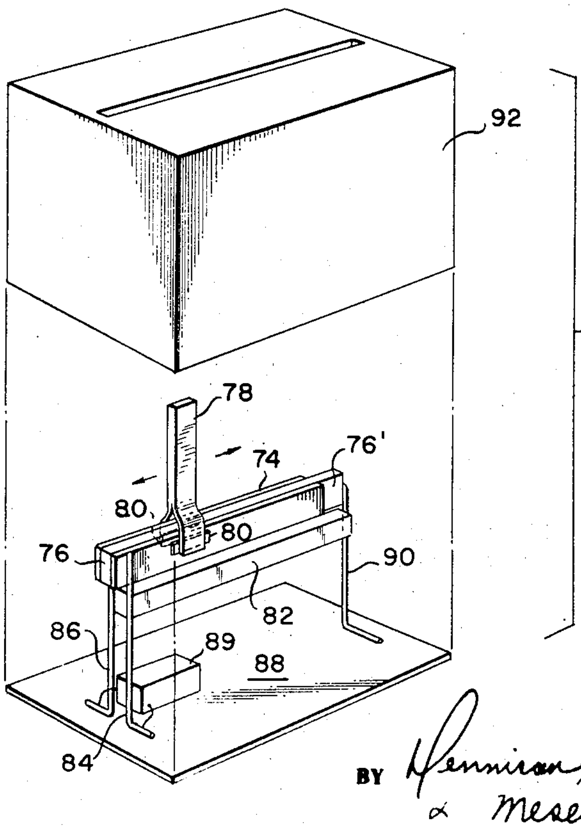

FIG. 8 illustrates another possible form of tuning means 30 which may be used in FIG. 1. Considering FIG. 8, the variable inductor 30 involves parallel electrical conductors 74 separated by an insulating cladding 76 having one end 76¹ thereof unexposed to electrically conducting material. An insulated tuning bar 78 is provided adjacent its lower end with connected metal wipers 80 which brush against the conductors 74 for variable line length tuning. An insulating guide bar 82 offers mechanical support. The upper ends of leads 84 and 86 connect to opposing ones of the conductors 74, whereas the lower ends of the leads are fastened to a base 88, from whence they extend to a circuit element 89 which is representative of that pictured in FIG. 1. A dummy support 90 affixed to base 88 at one end thereof is connected at its upper end to bar 82 and cladding 76'. It will be evident from the construction illustrated in FIG. 8 that the conductive wipers 80 will provide a short circuit at that portion of the conductors in contact therewith, with the arrangement being so disposed that the range of inductance variation extends over the frequencies desired. It will further be appreciated that the arrangement shown in FIG. 8 is linear in operation to the extent that it may be implemented with conventional pulleys, strings, etc., as in slide-rule radio tuning. A cover or top 92 provides a closed compartment for the alternative means shown in FIG. 8.

Figure 9:
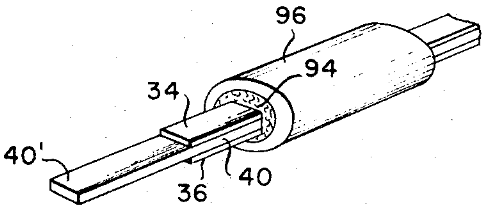
FIG. 9 shows in perspective a unique form of wiper for tuning purposes.

Another possible form of wiper to be used as part of tuning means 30 shown in FIG. 1 is illustrated in FIG. 9. This arrangement is substantially like FIGS. 5 and 6, except that the spring 35¹ is replaced by a conductive mesh or pile 94 which encircles the conductors 34 and 36. A sheath 96 of high dielectric constant is wrapped around the mesh 94. As was previously explained in the consideration of FIGS. 5 and 6, an annular block 42, omitted in FIG. 9 for the sake of simplicity, may be mounted astride the conductors 34 and 36 over the sheath 96 so that movement of the block will carry with it the sheath 96 and mesh 94 thereby producing a variation in the length of the shorted portion of the inductance and a corresponding variation in the center frequency of the oscillator. To a degree not available in the other arrangements herein disclosed, the mesh 94, in addition to producing a variation in line length, offers the desirable and additional advantage of scrubbing or cleaning of the surfaces of conductors 34 and 36 as the block is shifted in position. There is an advantage, of course, in maintaining the contact surfaces of conductors 34 and 36 rid of any accumulating deposits.

Figure 10:
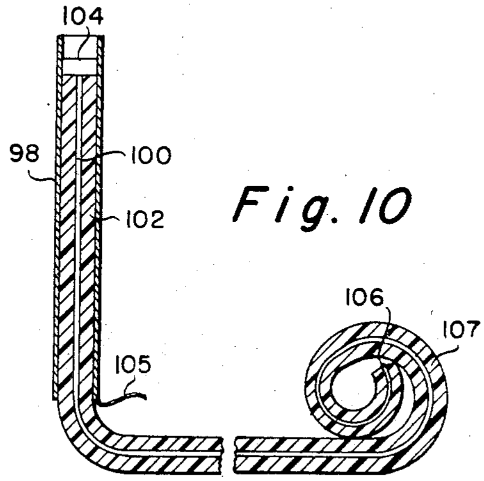
FIG. 10 is a view showing in detail another form of variable inductance means exemplary of the tuning mode applicable to the invention embodiment of FIG. 1.

In FIG. 10 I have shown an alternative form of tuning means to be used with the invention embodiment of FIG. 1. The parallel conductors in the form there illustrated are concentric conductive cylinders 98 and 100 separated by a dielectric material 102. A shorting brush 104 for varying the effective electrical length as seen by the terminals 105 and 106 is mounted across the tip end of cylinder 100 in contact with the inner surface of cylinder 98. By means of the tuning element segment 107, the brush 104 is made to traverse the longitudinal dimension of the cylinder 98. As illustrated in FIG. 10, it will be apparent that a considerable surface arc is available via cylinder 98 to act as the radiating element. Excellent omnidirectional radiation properties result. From the construction illustrated, it further will be evident that as movement is imparted to the brush 104, it varies the length of the tuned line thereby controlling the frequency of oscillation.

Figure 11:
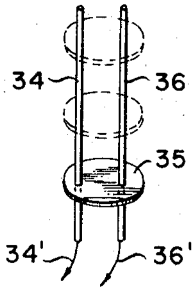
FIGS. 11 through 14, inclusive, diagrammatically illustrate how the proportion of the shorted portion to the unshorted portion of the tuning means varies as the tuning means is adjusted.
Figure 12:
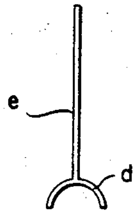
Figure 13:
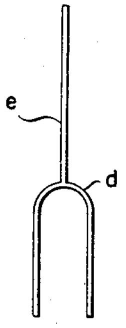
Figure 14:
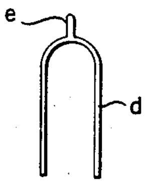

The illustrations depicting thus far the variable length tuning means 30 all have in common a unique loading feature which best may be explained with reference to FIGS. 11, 12, 13 and 14. In FIG. 11, I have diagrammatically illustrated the conductors 34 and 36, the associated shorting slide 35, circuit extending leads $34^1$ and $36^1$, and an open termination of the conductors 34 and 36. The slide 35 in FIG. 11 is shown in position a; other positions of the slide 35 are exemplified by the letters *b* and *c*. Considering FIG. 11, for example, the slide 35 in being conductively connected to both conductors 34 and 36 provides a short circuit over a portion of the line length of the reactance, and further provides an unshorted portion. The shorted portion *d* may be viewed in mechanical terms as a dipole coil radiator, while the unshorted portion e may be viewed as a monopole radiator. The highest frequency is obtained when the slide 35 is nearest the end of the line connected to transmitter 10. As is evident, the frequency progressively decreases as the slide is moved toward the open end of the line. It will be noticed, however, that as the slide is moved toward the open end of the line, (positions *b* and *c*) the movement in that direction progressively increases the shorted portion of the conductors 34 and 36 while progressively decreasing the unshorted portion of the line. Thus, as the tuned frequency is made to vary from a higher to a lower frequency, the length of the monopole radiator is progressively shortened whereas the dipole equivalent comprising the reactance progressively becomes greater. One effect of the specific geometry illustrated by FIGS. 12, 13 and 14 is that the effective Q of the oscillating or shorted portion of tuning means 30 varies as to the particular setting of slide 35; thus, there is in effect developed a variable Q resonating device which operates at a unique Q dependent upon the setting chosen. It is well known that the higher the Q in general, the more power that can be radiated in conjunction with a monopole loading effect. The length of tuning means 30 also determines the reactive characteristics of the tuner, and also controls the effective wave length at which the equivalent antenna is radiating. Stated differently, the transmitter 10 will radiate at multiple positions of the slide 35 at different operating frequencies, that is, operation will be in the quarter wave length mode for one position of the slide 35, and in the three-quarter wave length mode for another position of the slide 35. Thus, position a in FIG. 11 may be indicative of a ¼ wave length monopole radiator whereas position c in FIG. 11 may indicate a ¾ wave length loading.

A transmitter manufactured in accordance with the FIG. 1 invention embodiment is demonstrably superior to those of the prior art. In particular, such a transmitter has the feature of harmonic generation and in such capacity as to lend itself to widely diverse applications. To further advance this contention, by selecting variable geometrics of the variable length tuner 30 as exemplified in FIG. 1, and as, for example, variably controlling the base-emitter bias of transistor 12, the transmitter 10 can be made to exhibit very strong harmonic generation ranging from a fundamental frequency of 100MHz up to and inclusive of 1,000MHz and, perhaps, even yet beyond. Thus, in accordance with this feature of the invention, in the table below there is summarized approximate values of the energy content of the transmitted signal as a function of the harmonic frequency generated in terms of the fundamental frequency.

TABLE

| Frequency(Mhz) | Energy(%) |
|---|---|
| 100 | 100 |
| 200 | 90 |
| 300 | 89 |
| 400 | 85 |
| 500 | 83 |
| 600 | 79 |
| 700 | 60 |
| 800 | 50 |
| 900 | 40 |
| 1000 | 30 |

Summarizing briefly, it can be seen that I have provided a transistor controlled transmitter whose operation in the square law region produces a most favorable modulation excursion in response to modulating input signals of inappreciable value. In addition, in a novel manner combined with the transistor controlled transmitter, is a variable length tuning means which has multiple functions among which are that of antenna (radiator), tuner (shorted portion), resonating element (acts as a reactance), and switch (slider on exposed dielectric). In one exceptionally precise variable line length tuner exemplary of the invention the conductors 34 and 36 were approximately six inches in length and spaced approximately one-sixteenth inch apart by the dielectric 40.

Representative values of circuit components and types illustrated in FIG. 1 are listed as follows:

R16 — 510 ohms
R20 — 51 ohms
R22 — 220 kilohms
C14 — 51pf
C18 — 910pf
C42 — 47pf
Inductor 30 — 6 inches long, one-sixteenth inch separation
Dielectric 40 — Fiberglass
Transistor 12 is type 2N5179
Source 32 — 1.35 volts.

In the circuit illustrated in FIG. 1, an NPN-type transistor is used. A PNP configuration may be substituted in the circuit, as long as the polarity of source 32 is reversed. Moreover, although I have herein shown and described several forms of apparatus embodying my invention, it is to be understood that various changes and modifications may be made therein without departing from the spirit and scope of the claims.

I claim:

1. A frequency modulated transmitter comprising,
   a unitary tunable resonant circuit means, switch and radiating member having,
   a strip of dielectric material having a substantial portion of its length from a first end toward the second end covered on opposite sides with a layer of electrically conductive material and a portion of its length at the second end uncovered by the layers of conductive material ,
   a capacitor connected between the ends of said layers of conductive materialat the first end of said strip ; and
   a shorting means in contact with said layers of conductive material, slidably mounted on said strip from the first to the second ends thereof for shorting selectively different lengths of said layers for tuning the resonant circuit formed by said capacitor , the layers of conductive material and shorting means to different resonant frequencies, for opening the short between the conductive layers when said shorting means embraces the second end of said strip;
   an oscillator means for feeding energy to said resonant circuit means comprising ,
   a transistor having a collector terminal connected to the end of one of said layers of conductive material at the first end of said strip , a base terminal and an emitter terminal,
   a feed-back circuit having a capacitor connected between said collector and emitter terminals ,
   a biasing circuit comprising a resistor connected between said collector and base terminals ,
   a second resistor having a first end connected to said emitter terminal and
   a source of direct current voltage connected between the second end of said second resistor and one of the ends of said layers of conductive material at the first end of said strip and through said shorting means and other layer of conductive material to the collector terminal ,
   a radio frequency by-pass capacitor connected between said base terminal and the second end of said second resistor ; and
   an input means for modulating the frequency of said oscillator consisting of a pair of terminals , one connected to the base terminal of said transistor and the other connected to the second end of the second resistor whereby the modulating voltages are applied across the base-to-emitter junction of said transistor.

2. The invention as defined in claim 1, wherein said shorting means is slidable from the covered to the uncovered portions of said strip of dielectric material for disconnecting the source of voltage from the collector terminal of said transistor to discontinue the operation of said transmitter.

3. The invention as defined in claim 2, wherein said layers of conductive material on said dielectric are arranged in parallel to each other to provide distributed inductance and capacitance of the resonant circuit means , wherein the position of the shorting means on the covered portion of said strip determines the amount of inductive and capacitive reactance in the resonant circuit means and the resonant frequency thereof and wherein the portions of the layers of conductive material between the shorting means and the uncovered portion of said strip operates as the radiating member for the transmitter.

* * * * *